(12) United States Patent
Aoki

(10) Patent No.: US 11,811,363 B2
(45) Date of Patent: Nov. 7, 2023

(54) ELECTRONIC COMPONENT PACKAGES, ELECTRONIC COMPONENT, AND OSCILLATOR

(71) Applicant: Seiko Epson Corporation, Tokyo (JP)

(72) Inventor: Shinya Aoki, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/752,895

(22) Filed: May 25, 2022

(65) Prior Publication Data
US 2022/0385235 A1 Dec. 1, 2022

(30) Foreign Application Priority Data

May 26, 2021 (JP) .................. 2021-088218

(51) Int. Cl.
| | |
|---|---|
| *H03B 5/32* | (2006.01) |
| *H01L 25/16* | (2023.01) |
| *H01L 23/538* | (2006.01) |
| *H01L 23/00* | (2006.01) |

(52) U.S. Cl.
CPC .......... *H03B 5/32* (2013.01); *H01L 23/5383* (2013.01); *H01L 25/165* (2013.01); *H01L 24/13* (2013.01); *H01L 24/16* (2013.01); *H01L 2224/13144* (2013.01); *H01L 2224/16227* (2013.01)

(58) Field of Classification Search
CPC .................................... H01L 23/5383
USPC ........................................... 331/68
See application file for complete search history.

(56) References Cited

U.S. PATENT DOCUMENTS

| | | | |
|---|---|---|---|
| 8,760,231 B2 * | 6/2014 | Shimodaira .......... | H03H 9/0547 310/317 |
| 2014/0152392 A1 * | 6/2014 | Owaki ................... | H03H 9/10 331/68 |

FOREIGN PATENT DOCUMENTS

JP          2009-060260 A        3/2009

* cited by examiner

*Primary Examiner* — Joseph Chang
(74) *Attorney, Agent, or Firm* — Harness, Dickey & Pierce, P.L.C.

(57) ABSTRACT

An electronic component package includes a lid, a first layer, a second layer disposed between the first layer and the lid and configuring a first frame, a third layer disposed between the second layer and the lid and configuring a second frame, a bonding member bonding the third layer to the lid, and a via wire electrically coupled to the lid and penetrating the second frame, in which, when an inner diameter of a first corner portion of the first frame is denoted by R1 and an inner diameter of a second corner portion of the second frame overlapping the first corner portion in a plan view is denoted by R2, R1<R2, and an inner surface of the second corner portion protrudes more than an inner surface of the first corner portion in a cross-sectional view.

10 Claims, 5 Drawing Sheets

ELECTRONIC COMPONENT PACKAGES, ELECTRONIC COMPONENT, AND OSCILLATOR

The present application is based on, and claims priority from JP Application Serial Number 2021-088218, filed May 26, 2021, the disclosure of which is hereby incorporated by reference herein in its entirety.

BACKGROUND

1. Technical Field

The present disclosure relates to an electronic component package, an electronic component, and an oscillator.

2. Related Art

For example, JP-A-2009-60260 discloses an electronic component package that has a configuration in which a frame-shaped second insulating layer is stacked on an upper portion of a flat plate-shaped first insulating layer and a frame-shaped third insulating layer is stacked on the second insulating layer, and includes a base having a recess and a rectangular shape in a plan view, and a lid in which a sealing material is formed and which has a rectangular shape in a plan view. In the base, some of four corners of an inner circumference of the second insulating layer protrude in an internal direction of a recess and are exposed in a plan view. Thereby, although a molten sealing material flows down an inner bottom surface in the base through an inner wall, the molten sealing material stays in the exposed portion in a plan view due to surface tension, and furthermore, it is stated that it is difficult for the molten sealing material to flow into the inner bottom surface of the base on a lower side and reliable airtight seal can be performed.

However, in an electronic component package described in JP-A-2009-60260, a molten sealing material flows in through an electrode of an inner wall up to an exposed portion in a plan view, and thus, there is a possibility that a sealing material in a sealing region is insufficient, and there is a problem that airtightness is reduced.

SUMMARY

An electronic component package includes a lid, a first layer, a second layer disposed between the first layer and the lid and configuring a first frame, a third layer disposed between the second layer and the lid and configuring a second frame, a bonding member bonding the third layer to the lid, and a via wire electrically coupled to the lid and penetrating the second frame, in which, when an inner diameter of a first corner portion of the first frame is denoted by R1 and an inner diameter of a second corner portion of the second frame overlapping the first corner portion in a plan view is denoted by R2, R1<R2, and an inner surface of the second corner portion protrudes more than an inner surface of the first corner portion in a cross-sectional view.

An electronic component includes the electronic component package described above and an integrated circuit element accommodated in the electronic component package.

An oscillator includes the electronic component package described above, a resonator accommodated in the electronic component package, and an integrated circuit element including an oscillation circuit that oscillates the resonator.

DESCRIPTION OF EXEMPLARY EMBODIMENTS

1. First Embodiment

Figure 1:
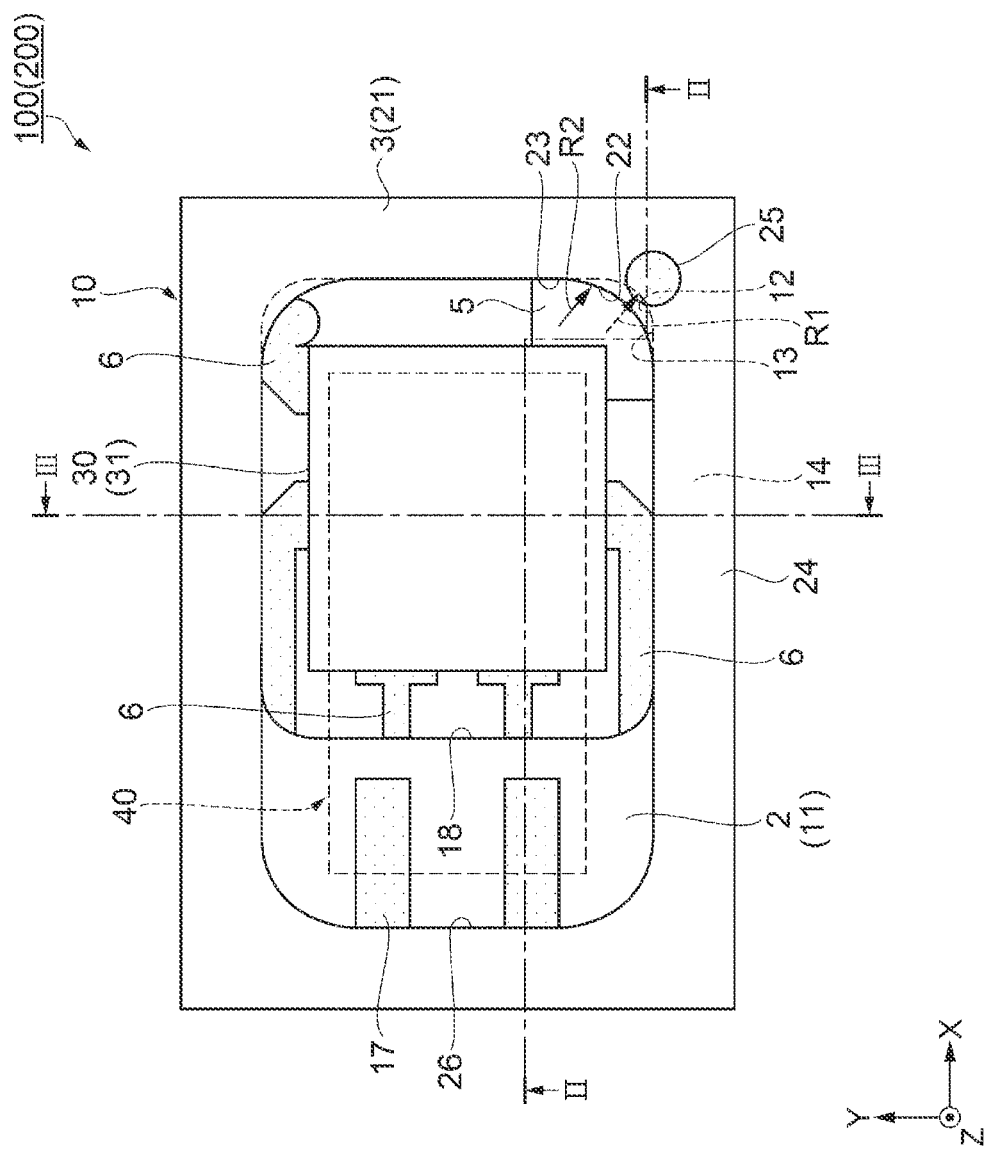
FIG. 1 is a plan view illustrating a schematic structure of an electronic component including an electronic component package of a first embodiment.

First, as an electronic component 100 including an electronic component package 10 of a first embodiment, an oscillator 200 accommodating an integrated circuit element 30 and a resonator 40 is taken as an example, and description will be made with reference to FIGS. 1, 2, and 3.

FIG. 1 illustrates a state in which a lid 9 and the resonator 40 are omitted for the sake of convenient description of an internal configuration of the oscillator 200 and the electronic component package 10. Further, for the sake of convenient description, an X axis, a Y axis, and a Z axis are illustrated in the following drawings as three axes orthogonal to each other. Further, a direction along the X axis is denoted by an "X direction", a direction along the Y axis is denoted by a "Y direction", and a direction along the Z axis is denoted by a "Z direction". Further, an arrow side of each axis is also denoted by a "plus side", and a side opposite to the arrow is also denoted by a "minus side". Further, the plus side in the Z direction is also denoted by "up", and the minus side in the Z direction is also denoted by "down".

Figure 2:
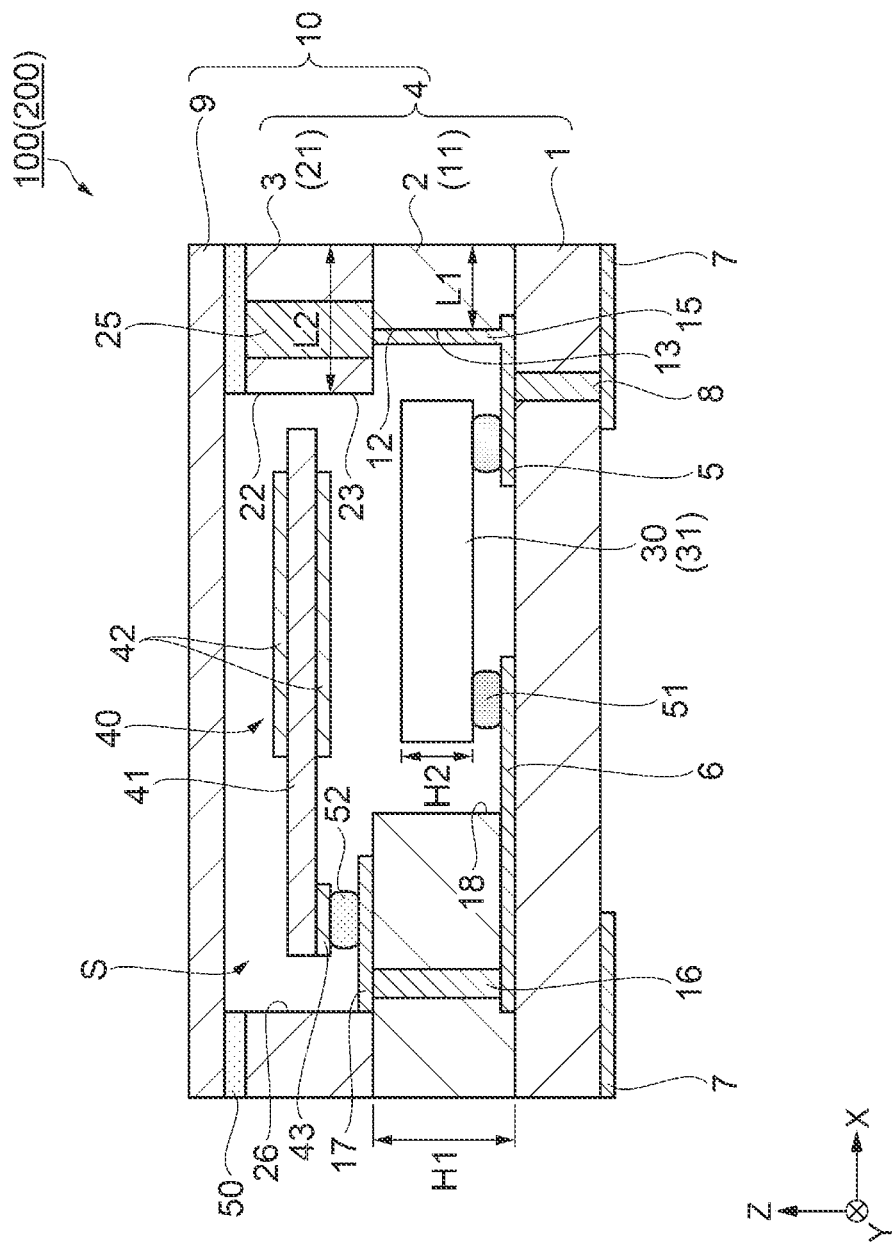
FIG. 2 is a cross-sectional view taken along line II-II in FIG. 1.
Figure 3:
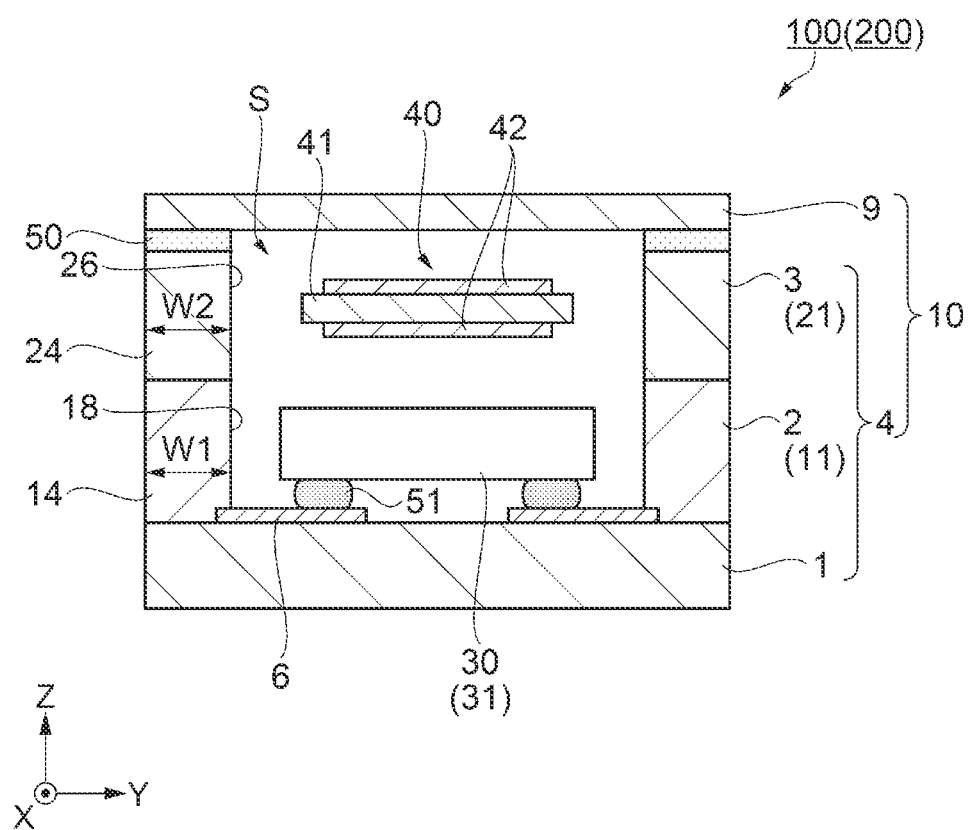
FIG. 3 is a cross-sectional view taken along line III-III in FIG. 1.

As illustrated in FIGS. 1, 2, and 3, the oscillator 200 includes the integrated circuit element 30, the resonator 40, and the electronic component package 10 that accommodates the integrated circuit element 30 and the resonator 40.

The electronic component package 10 includes a base 4, the lid 9 forming an internal space S between the base 4 and the lid 9, and a bonding member 50 for bonding the base 4 to the lid 9, and the integrated circuit element 30 and the resonator 40 are accommodated in the internal space S.

The base 4 has a rectangular shape in a plan view in the Z direction, and is disposed between a flat plate-shaped first layer 1, and the first layer 1 and the lid 9, and is disposed between a second layer 2 configuring a first frame 11, and the second layer 2 and the lid 9, and includes a third layer 3 configuring a second frame 21, and is formed by stacking a second layer 2 on the first layer 1 and a third layer 3 on the second layer 2.

Electrodes 5 and 6 are formed on a surface facing the integrated circuit element 30 on the first layer 1 to electrically couple and fix the integrated circuit element 30 through a bonding member 51 such as a gold bump. Further, an external terminal 7 that outputs an output signal of the integrated circuit element 30 to the outside, the external terminal 7 that is electrically coupled to the lid 9 through the electrode 5 and is a ground electrode, or the like is formed on a surface opposite to the surface on which the electrodes 5 and 6 are formed. A plurality of via wires 8 penetrating upper and lower surfaces of the first layer 1 are formed in the first layer 1 and electrically couple the electrodes 5 and 6 to the external terminal 7. Further, a via wire is formed by filling a conductive material in a through-hole penetrating upper and lower surfaces of a layer.

Further, the electrode 5 is electrically coupled to the integrated circuit element 30 and a side wire 15 to be described below and is provided at a corner portion of a mounting region of the first layer 1 that is partitioned by the first frame 11. More specifically, the electrode 5 is provided in a region in contact with a first corner portion 12 of the first frame 11.

The second layer 2 is provided with an opening 18 for forming the first frame 11 and is formed with an internal terminal 17 that electrically couples and fixes the resonator 40 to a surface facing the resonator 40 through the bonding member 52 such as a conductive adhesive. Further, a plurality of via wires 16 penetrating upper and lower surfaces of the second layer 2 are formed in the second layer 2 and electrically couple the internal terminal 17 to the electrodes 6 formed in the first layer 1. Four corner portions including the first corner portion 12 in the opening 18 of the first frame 11 are provided with corner portions having an inner diameter R1. Further, as illustrated in FIG. 2, the side wire 15 is formed on an inner surface 13 which is a side surface of the first corner portion 12 and is electrically coupled to the electrode 5 formed on the first layer 1 and a via wire 25 provided in the second frame 21 to be described below. In the present embodiment, the side wire 15 is formed on the inner surface 13 of the first corner portion 12, but the side wire 15 is not limited thereto and may also be formed on an outer side surface which is a side surface opposite to the integrated circuit element 30 of the first corner portion 12.

Further, a thickness H1 which is a dimension of the second layer 2 in the Z direction is greater than a thickness H2 which is a dimension of the integrated circuit element 30 in the Z direction. Therefore, a large-sized integrated circuit element 30 can be accommodated in the opening 18 for forming the first frame 11 of the second layer 2, compared to a case in which the thickness H1 of the second layer 2 is less than the thickness H2 of the integrated circuit element 30.

The third layer 3 is provided with an opening 26 for forming the second frame 21 at a position overlapping the opening 18 of the second layer 2 in a plan view in the Z direction. Further, the opening 26 of the third layer 3 is formed such that a minus side in the X direction is wider than the opening 18 of the second layer 2. Therefore, the internal terminal 17 for fixing the resonator 40 is exposed, and the resonator 40 can be fixed onto the internal terminal 17 before being sealed by the lid 9. Four corner portions including a second corner portion 22 in the opening 26 of the second frame 21 are provided with corner portions having an inner diameter R2.

Further, a via wire 25 penetrating upper and lower surfaces of the third layer 3 is formed, in the third layer 3, at a position in contact with the first corner portion 12 of the second layer 2 near the second corner portion 22. The via wire 25 is electrically coupled to the lid 9 through the bonding member 50 and is electrically coupled to the side wire 15 provided on the inner surface 13 of the first corner portion 12 of the second layer 2.

Further, as illustrated in FIG. 1, in a plan view in the Z direction, a relationship between the inner diameter R2 of the second corner portion 22 of the second frame 21 and the inner diameter R1 of the first corner portion 12 of the first frame 11 is R1<R2, that is, the inner diameter R2 of the second corner portion 22 of the second frame 21 is greater than the inner diameter R1 of the first corner portion 12 of the first frame 11. Therefore, as illustrated in FIG. 2, an inner surface 23 of the second corner portion 22 protrudes in a minus X direction with respect to the inner surface 13 of the first corner portion 12 in a cross-sectional view in the Y direction. Specifically, a length L2 from an outer side surface of the second frame 21 to the inner surface 23 of the second corner portion 22 is greater than a length L1 from an outer side surface of the first frame 11 to the inner surface 13 of the first corner portion 12.

Further, as illustrated in FIG. 3, in the base 4 of the electronic component package 10, the first frame 11 that is the second layer 2 includes a first straight portion 14 extending in the minus X direction from the first corner portion 12, the second frame 21 that is the third layer 3 includes a second straight portion 24 extending in the minus X direction from the second corner portion 22 and overlapping the first straight portion 14 in a plan view, and a width W1 of the first straight portion 14 and a width W2 of the second straight portion 24 are equal to each other. Further, in the first frame 11, a width of a straight portion extending in a plus Y direction from the first corner portion 12 is equal to a width of a straight portion extending in the plus Y direction from the second corner portion 22 of the second frame 21. Further, a width of a straight portion extending in a minus X direction from a corner portion at an X-axis symmetrical position and the first corner portion 12 of the first frame 11 is equal to a width of a straight portion extending in the minus X direction from a corner portion at an X-axis symmetrical position and the second corner portion 22 of the second frame 21. In this way, by making the widths of the straight portions of the first frame 11 and the second frame 21 configuring the base 4 equal to each other, a mechanical strength of the base 4 can be increased.

Various ceramics such as oxide-based ceramic, nitride-based ceramic, and carbide-based ceramic are suitably used as constituent materials of the first layer 1, the second layer 2, and the third layer 3 configuring the base 4 and a silicon substrate, a glass substrate, or the like may also be used.

The lid 9 is a flat plate of a rectangular shape in a plan view from the Z direction and is bonded to an upper surface of the base 4 through the bonding member 50. Thereby, an airtight internal space S is formed between the base 4 and the lid 9, and the integrated circuit element 30 and the resonator 40 are accommodated in the internal space S. The internal space S is in a decompression state, preferably in a state closer to vacuum. Thereby, viscous resistance is reduced, and oscillation characteristics of the resonator 40 are increased. A constituent material of the lid 9 is desirably formed of a material such as a conductive metal and can shield the integrated circuit element 30 and the resonator 40 from noise such as electromagnetic waves from the outside.

The bonding member 50 is solder or the like including an alloy of Au and Sn, and by including the alloy of Au and Sn, a melting point temperature goes up, and it is possible to reduce influence of heat when the electronic component package 10 is mounted over a printed circuit board or the like.

The integrated circuit element 30 accommodated in the internal space S includes an oscillation circuit 31 that oscillates the resonator 40.

The oscillation circuit 31 is electrically coupled to the resonator 40, amplifies an output signal of the resonator 40, feeds back the amplified signal to the resonator 40, and thereby, the resonator 40 oscillates.

The resonator 40 accommodated in the internal space S includes a vibration substrate 41, an excitation electrode 42 that vibrates the vibration substrate 41, an electrode pad 43 that outputs a vibration signal to the outside and fixes the resonator 40 to the electronic component package 10, and a lead electrode that electrically couples the excitation electrode 42 (not illustrated) to the electrode pad 43.

The resonator 40 is fixed over the internal terminal 17 formed on an upper surface of the second layer 2 of the electronic component package 10 through the bonding member 52 such as a conductive adhesive. A state in which the resonator 40 is fixed to the electronic component package 10 indicates that the internal terminal 17 formed on an upper surface of the second layer 2 of the electronic component package 10 is mechanically and electrically coupled to the electrode pad 43 formed on the vibration substrate 41 of the resonator 40 through the bonding member 52. An AT cut quartz crystal substrate, an SC cut quartz crystal substrate, a BT cut quartz crystal substrate, or the like is used as the vibration substrate 41.

By providing the integrated circuit element 30 of the oscillator 200 of the present embodiment with a temperature compensation circuit or a temperature sensor, the integrated circuit element 30 can be used as a temperature compensated crystal oscillator (TCXO) that reduces influence of a change in external temperature and outputs a highly accurate oscillation frequency.

As described above, since the oscillator 200 serving as the electronic component package 10 and the electronic component 100 of the present embodiment is provided with the via wire 25 that is electrically coupled to the lid 9 and penetrates the second frame 21, the bonding member 50 that bonds the third layer 3 to the lid 9 does not flow into the electronic component package 10 through the inner surface 23 of the second frame 21, and thus, there is no shortage of the bonding member 50 that is a sealing material of a sealing region, and a decrease in airtightness can be reduced.

Further, the inner surface 13 of the first corner portion 12 of the first frame 11 is recessed with respect to the inner surface 23 of the second corner portion 22 of the second frame 21, and the inner diameter R1 of the first corner portion 12 is less than the inner diameter R2 of the second corner portion 22, and furthermore, the thickness H1 of the second layer 2 configuring the first frame 11 is greater than the thickness H2 of the integrated circuit element 30, and thus, the integrated circuit element 30 having the larger size can be accommodated in the electronic component package 10.

2. Second Embodiment

Next, as an electronic component 100a including an electronic component package 10a of a second embodiment, an oscillator 200a accommodating a first integrated circuit element 30a, a second integrated circuit element 34, a heater 36, and the resonator 40 is taken as an example, and description will be made with reference to FIGS. 4 and 5.

Figure 4:
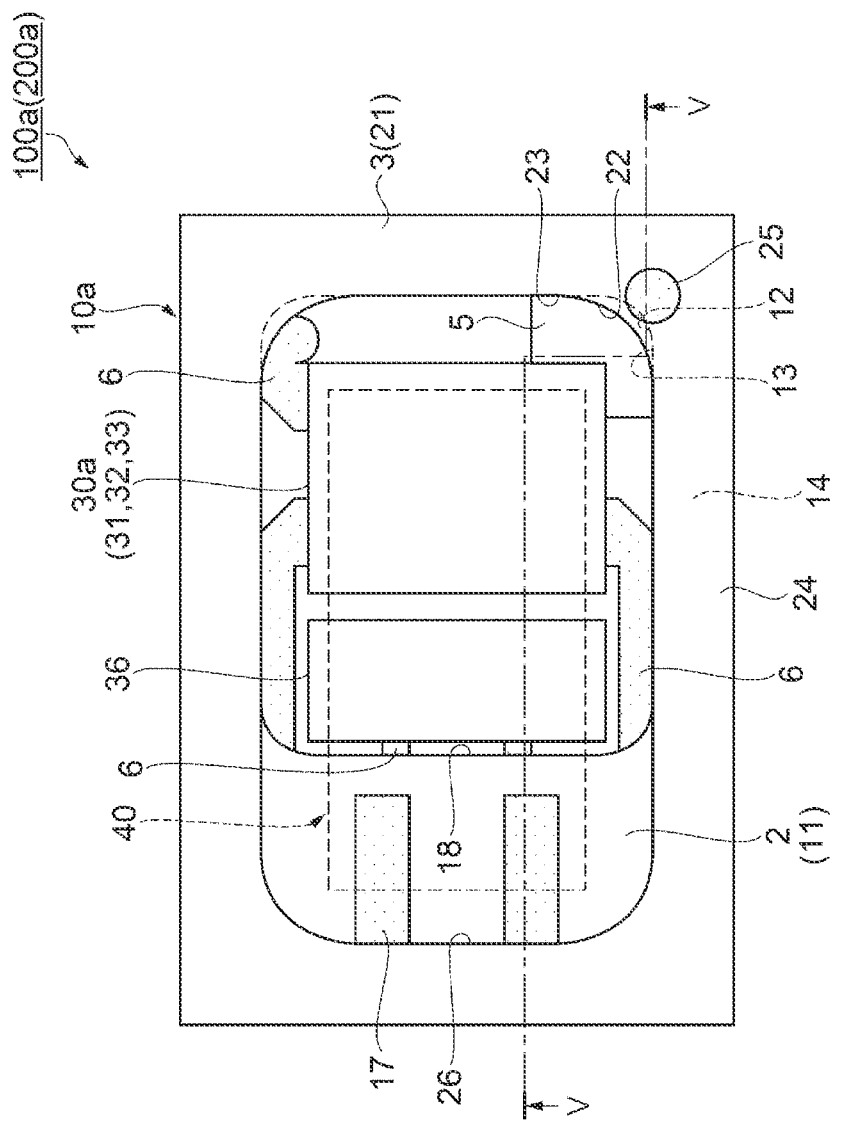
FIG. 4 is a plan view illustrating a schematic structure of an electronic component including an electronic component package of a second embodiment.

FIG. 4 illustrates a state in which a lid 9 and the resonator 40 are omitted for the sake of convenient description of an internal configuration of the oscillator 200a and the electronic component package 10a.

The electronic component package 10a and the oscillator 200a of the present embodiment are the same as the electronic component package 10 and the oscillator 200 of the first embodiment except that the electronic component package 10a is different in structure from the electronic component package 10 of the first embodiment and the first integrated circuit element 30a, the second integrated circuit element 34, and the heater 36 instead of the integrated circuit element 30 are accommodated in the electronic component package 10a compared to the oscillator 200 of the present embodiment. Differences from the first embodiment described above will be mainly described, and the same matters will be designated by the same reference numerals, and descriptions thereof are omitted.

Figure 5:
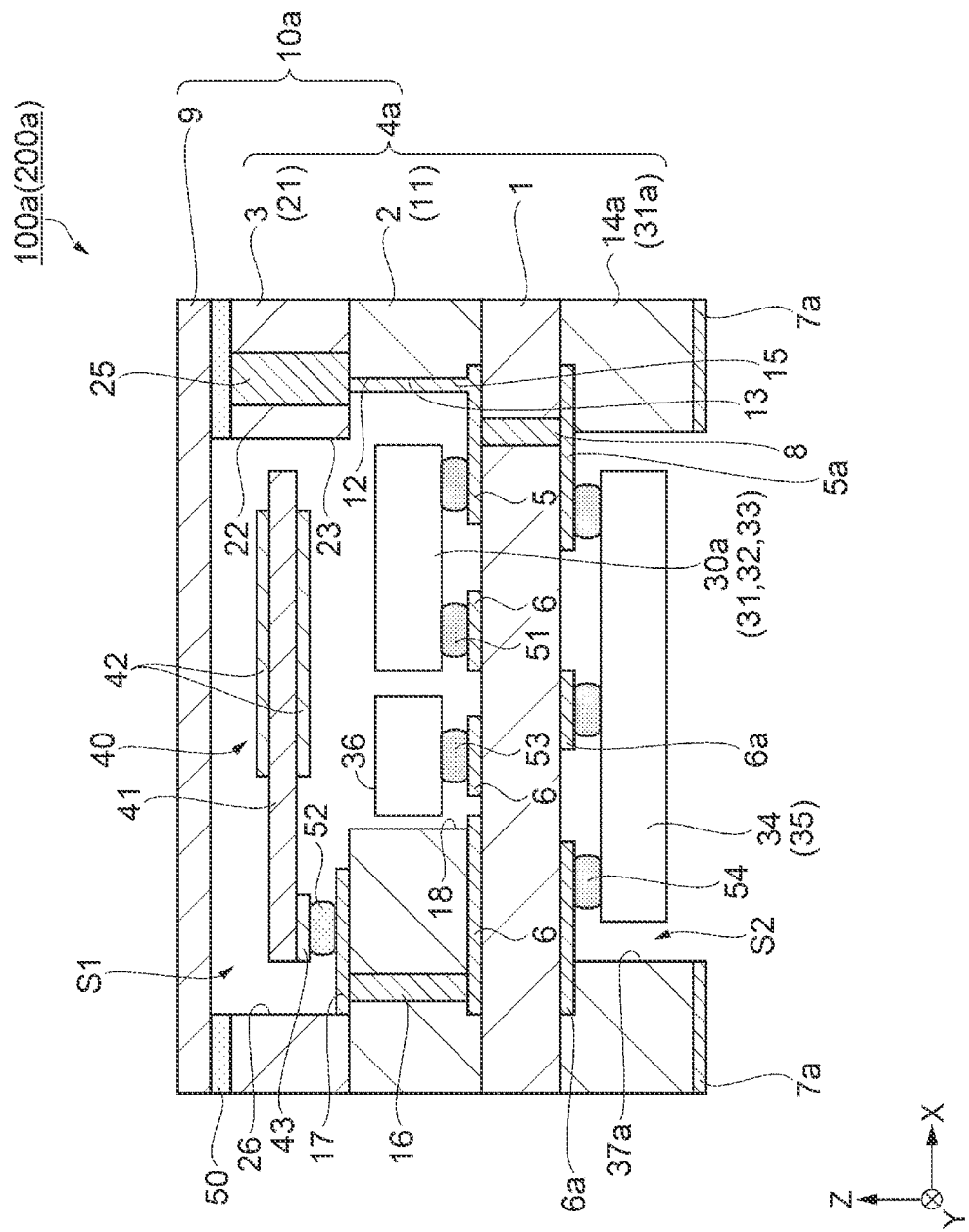
FIG. 5 is a cross-sectional view taken along line V-V in FIG. 4.

As illustrated in FIGS. 4 and 5, the oscillator 200a includes the first integrated circuit element 30a, the second integrated circuit element 34, the heater 36, the resonator 40, and the electronic component package 10a that accommodates the first integrated circuit element 30a, the second integrated circuit element 34, the heater 36, and the resonator 40.

The oscillator 200a of the present embodiment corresponds to an oven-controlled crystal oscillator (OCXO) with the electronic component package 10a, which serves as a constant temperature bath, including the heater 36.

The electronic component package 10a includes a base 4a having a first internal space S1 and a second internal space S2, the lid 9 that seals the first internal space S1, and a bonding member 50 that bonds the lid 9 to the base 4a, the first internal space S1 accommodates the first integrated circuit element 30a, the heater 36, and the resonator 40, and the second internal space S2 accommodates the second integrated circuit element 34.

In the base 4a, a first layer 1, a second layer 2 that includes an opening 18 and forms a first frame 11, and a third layer 3 that includes an opening 26 and forms a second frame 21 are stacked to form the first internal space S1, and a fourth layer 14a that includes an opening 37a and forms a third frame 31a is stacked, on a surface of the first layer 1 opposite to a surface on which the second layer 2 is stacked, to form the second internal space S2. Further, an external terminal 7a for outputting an oscillation frequency is formed on a surface of the fourth layer 14a opposite to a surface on which the first layer 1 is stacked.

The first integrated circuit element 30a accommodated in the first internal space S1 includes an oscillation circuit 31, a temperature compensation circuit 32, and a temperature sensor 33.

The oscillation circuit 31 is electrically coupled to the resonator 40, amplifies an output signal of the resonator 40, feeds back the amplified signal to the resonator 40, and thereby, the resonator 40 oscillates.

The temperature compensation circuit 32 compensates a temperature based on temperature information output from the temperature sensor 33 such that frequency fluctuation of an oscillation signal of the oscillation circuit 31 is less than frequency-temperature characteristics of the resonator 40 itself. Thereby, excellent temperature characteristics can be obtained. The temperature compensation circuit 32 may adjust an oscillation frequency of the oscillation circuit 31 by adjusting, for example, capacitance of a variable capacitance circuit coupled to the oscillation circuit 31 and adjust a frequency of an output signal of the oscillation circuit 31 by using a phase locked loop (PLL) circuit or a direct digital synthesizer circuit.

The temperature sensor 33 is an element for detecting a temperature and can be formed by providing an Si diode or a PNP transistor in the first integrated circuit element 30a.

The heater 36 accommodated in the first internal space S1 is used to keep the temperature in the first internal space S1 in which the resonator 40 is accommodated at a constant temperature. The heater 36 is formed over an upper surface of the first layer 1 and is fixed onto an electrode 6 electrically coupled to a temperature control circuit 35 of the second integrated circuit element 34 through a bonding member 53 such as a metal bump.

The second integrated circuit element 34 accommodated in the second internal space S2 includes the temperature control circuit 35 for controlling a temperature of the heater 36 and is fixed onto electrodes 5a and 6a formed on a lower surface of the first layer 1 through a bonding member 54 such as a metal bump.

The temperature control circuit 35 is a circuit for keeping the resonator 40 at a constant temperature by controlling the amount of current flowing through the heater based on temperature information output from the temperature sensor 33. For example, when a current temperature determined from an output signal of the temperature sensor 33 is lower than a set reference temperature, the temperature control circuit 35 causes a desired current to flow through the heater 36, and when the current temperature is higher than the reference temperature, the temperature control circuit 35 controls the current so as not to flow through the heater 36.

Further, for example, the temperature control circuit 35 may control the amount of current flowing through the heater 36 so as to increase or decrease according to a difference between the current temperature and the reference temperature. Here, the temperature sensor 33 serves as a temperature sensor for the temperature compensation circuit and a temperature sensor for the temperature control circuit 35. Therefore, the number of components can be reduced, and a size of the oscillator 200a can be reduced. However, the temperature sensor is not limited thereto, and the temperature sensor for the temperature compensation circuit and the temperature sensor for the temperature control circuit 35 may be provided separately.

With such a configuration, the oscillator 200a can be obtained which reduces influence of an external temperature and outputs a highly accurate oscillation frequency, and the same effect as in the electronic component package 10 or the oscillator 200 of the first embodiment can be obtained.

What is claimed is:

1. An electronic component package comprising:
   a lid;
   a first layer;
   a second layer disposed between the first layer and the lid and configuring a first frame, the first frame having a first corner portion, the first corner portion having a first inner diameter R1 in a plan view;
   a third layer disposed between the second layer and the lid and configuring a second frame the second frame having a second corner portion, the second corner portion having a second inner diameter R2 in the plan view, the first corner portion overlapping the second corner portion in the plan view;
   a bonding member bonding the third layer to the lid; and
   a via wire electrically coupled to the lid and penetrating the second frame, wherein
   R1<R2, and
   an inner surface of the second corner portion is located closer to a center of the electronic component package than an inner surface of the first corner portion and the via wire in the plan view.

2. The electronic component package according to claim 1, wherein
   the first frame includes a first straight portion extending from the first corner portion,
   the second frame includes a second straight portion extending from the second corner portion and overlapping the first straight portion in the plan view, and
   a width of the first straight portion and a width of the second straight portion are equal to each other.

3. The electronic component package according to claim 1, further comprising:
   a side wire electrically coupled to the via wire and provided on a side surface of the first frame.

4. The electronic component package according to claim 3, wherein
   the side wire is provided on an inner surface of the first frame.

5. The electronic component package according to claim 1, wherein
   the bonding member includes an alloy of Au and Sn.

6. An electronic component comprising:
   the electronic component package including the first layer, the second layer configuring the first frame, and the third layer configuring the second frame, according to claim 1; and
   an integrated circuit element accommodated in the electronic component package.

7. The electronic component according to claim 6, wherein
   the electronic component package includes an electrode electrically coupled to the integrated circuit element, and
   the electrode is provided at a corner portion of a mounting region of the first layer that is partitioned by the first frame.

8. The electronic component according to claim 6, wherein
   a thickness of the second layer is greater than a thickness of the integrated circuit element.

9. An oscillator comprising:
   the electronic component package including the first layer, the second layer configuring the first frame, and the third layer configuring the second frame, according to claim 1;
   a resonator accommodated in the electronic component package; and
   an integrated circuit element including an oscillation circuit that oscillates the resonator.

10. The oscillator according to claim 9, wherein
    a thickness of the second layer is greater than a thickness of the integrated circuit element.

* * * * *